United States Patent [19]
Alet

[11] 3,933,037
[45] Jan. 20, 1976

[54] DEVICE INCLUDING A THERMOSTATIC ENCLOSURE, WHICH IS SUSPENDED FROM A TROPOSPHERIC BALLOON

[75] Inventor: Irénée Alet, Toulouse, France

[73] Assignee: Centre National d'Etudes Spatiales, Paris, France

[22] Filed: Jan. 29, 1974

[21] Appl. No.: 437,640

[30] Foreign Application Priority Data
Feb. 6, 1973 France .............................. 73.04080

[52] U.S. Cl. .............................................. 73/170 R
[51] Int. Cl.² ......................................... G01W 1/08
[58] Field of Search ................... 73/170 R; 165/147; 174/15 R, DIG. 6

[56] References Cited
UNITED STATES PATENTS

| | | |
|---|---|---|
| 2,652,722 | 9/1953 | Wood .............................. 73/170 R |
| 2,837,916 | 6/1958 | Humphreys ...................... 73/170 R |
| 3,013,104 | 12/1961 | Young ........................ 174/DIG. 52 |
| 3,529,071 | 9/1970 | Kafka ............................ 174/DIG. 6 |
| 3,595,982 | 7/1971 | Kafka ............................ 174/DIG. 6 |

Primary Examiner—James J. Gill
Assistant Examiner—Anthony V. Ciarlante
Attorney, Agent, or Firm—Wigman & Cohen

[57] ABSTRACT

Device suspended from a balloon, said device including a heat-insulated thermostatic enclosure which is arranged within an open nacelle fitted inside a sheath acting as a sunshade. The outside air, having a low and practically stable temperature at high altitudes, is sucked into the device and stabilizes the temperature of an airborne equipment.

13 Claims, 3 Drawing Figures

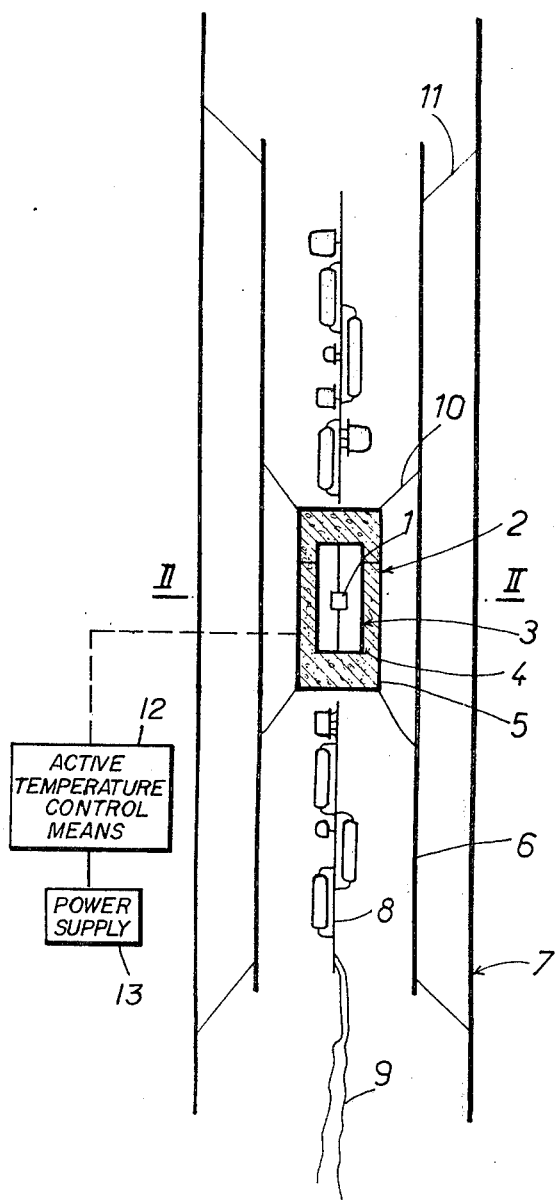
FIG.:1
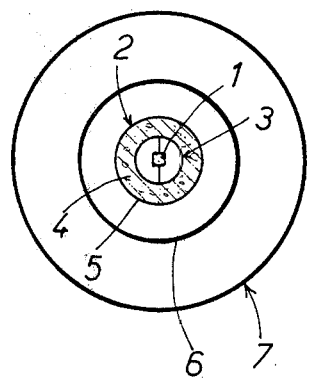
FIG.:2

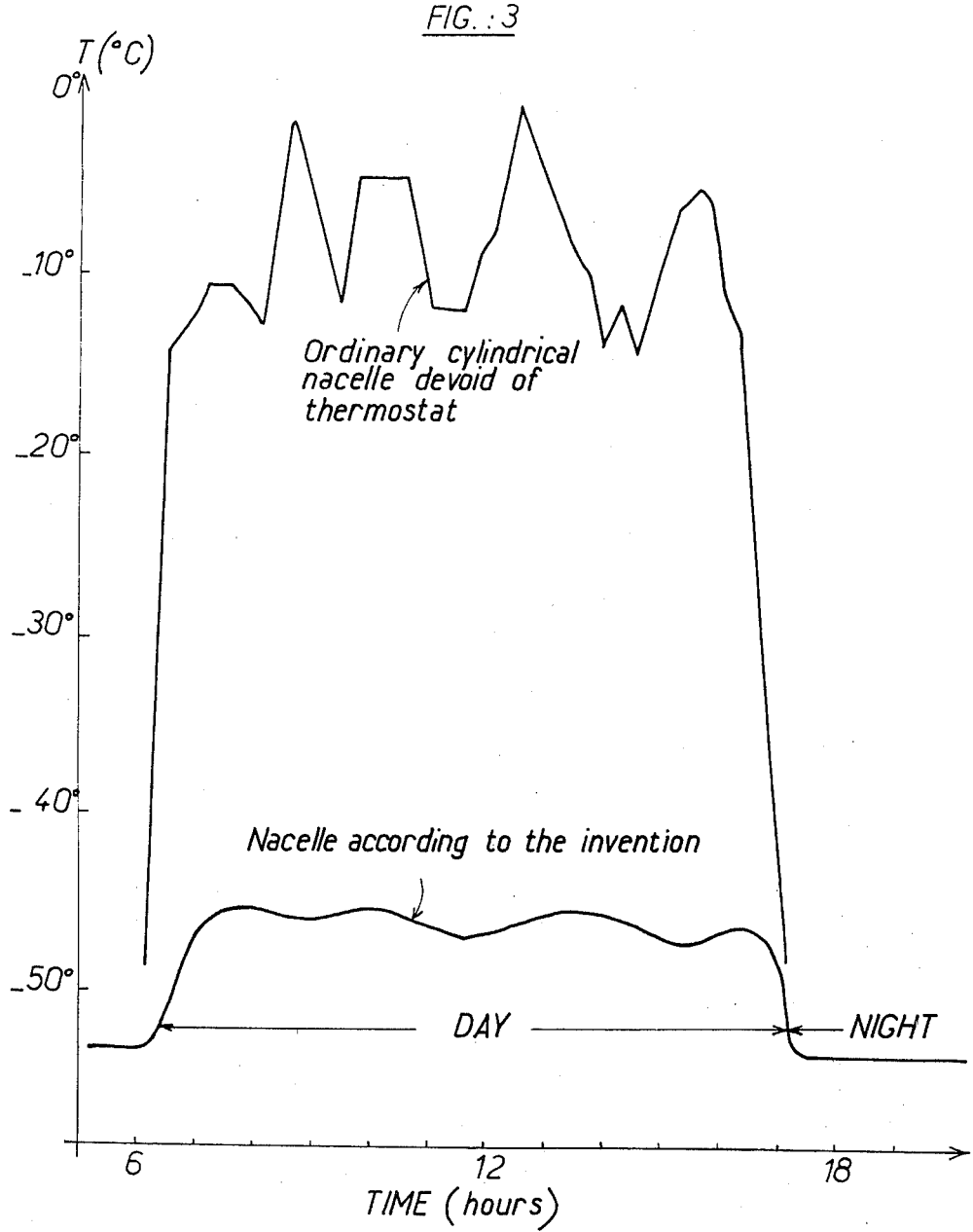

DEVICE INCLUDING A THERMOSTATIC ENCLOSURE, WHICH IS SUSPENDED FROM A TROPOSPHERIC BALLOON

The present invention relates to a balloon-suspended device and more particularly to a device which includes a thermostatic enclosure (i.e. within which the temperature must remain substantially constant) and which is adapted to be suspended from a constant-ceiling balloon.

In one specific application, to wit one involving a crystal oscillator for giving the position of the balloon by means of an appropriate ground-based or satellite-borne facility, the stability of the oscillation frequency is particularly affected by the temperature of the crystal, thus making it important to avoid unduly large crystal temperature fluctuations in order to prevent oscillator frequency drifts that would lead to errors in determining the position of the balloon. The temperature variations occuring inside the nacelles customarily used are due to the daily variations in the external radiation fluxes (solar and albedo radiation).

For such or like applications, it is common practice to use "active" control means, that is to say means which include a real thermostat and an external energy source to control it. However, such systems are complex, costly, heavy and dangerous to air navigation. The difficulties stem from the fact that the aim is usually to achieve a controlled temperature differing greatly from the ambient temperature. In seeking to circumvent these difficulties, it was realized that it was possible to make use of a source of air of reasonably constant temperature for a given ceiling altitude, to wit the surrounding air. For at a given altitude above 10,000 feet the ambient temperature is virtually constant, and there is notably no difference between day and night temperatures.

Accordingly, in the subject device of this invention, the required temperature stability inside the enclosure of the device is obtained by coupling the enclosure to the cold source formed by the ambient air.

To that end, said device is formed by a thermally insulated enclosure arranged within a convection sheath. The function of this sheath is to both intercept external radiations (solar and albedo) and assist convection of the ambient air that continuously cools the enclosure by flowing around and along it. The thermal insulation of the enclosure is intended to augment its thermal inertia and thereby integrate rapid temperature fluctuations inside the enclosure resulting from variations in the external fluxes and instabilities in the convection phenomena. It is to be noted, however, that this enclosure could be associated also with active control means, well-known per se as already stated herein, in which case the thermal regulation process can be supplemented by the use of very small amounts of energy provided by an on-board energy source.

The description which follows with reference to the accompanying non-limitative exemplary drawing will give a clear understanding of how the invention can be carried into practice.

In the drawing:

FIG. 1 is an axial longitudinal sectional portrayal of the subject device of this invention;

FIG. 2 is a cross-section taken through II—II of FIG. 1; and

FIG. 3 is a graph illustrating the results obtained.

FIG. 1 shows the general arrangement of a device according to this invention. The crystal oscillator schematically designated by reference numeral 1 is contained in an enclosure 2. The latter includes a thin interior casing 3 made of copper-beryllium, the function of which is to homogenize the temperatures inside the enclosure since the device is necessarily subject to thermal asymetry because one of its sides is exposed to the sun and the other is in shadow. Casing 3 is surrounded by a layer of insulating material 4 (which may be 1 cm-thick expanded polystyrene, for example) or by an evacuated enclosure (a Dewar flask) which provides good insulation and consequently enhanced thermal inertia. This enclosure has its entire surface coated with a thin film of aluminum 5 which is polished to a mirror finish for insulation against radiation.

The enclosure 2 may be suspended by thermally insulating nylon cords 10 attached to the ends of a "nacelle" to form a first sheath 6 coated internally and externally with aluminum polished to a mirror finish. Said nacelle is in turn arranged within a "sunshade" to form a second sheath 7 likewise coated internally with mirror-finish aluminum and connected to said nacelle by nylon cords 11.

In one exemplary embodiment, the sunshade may be 100 cm long, the nacelle 70 cm long and the enclosure 10 cm long. Assuming the diameter of the sunshade to be 12 cm, that of the nacelle may be 7 cm and that of the enclosure 5 cm. As FIG. 1 clearly shows, the sunshade extends beyond both ends of the nacelle.

The nacelle also houses the remainder of the electronic measurement and communications circuitry 8. Connections 9 lead underneath to a second device (not shown) carrying the energy generating sources (photocells).

The external surface of the sunshade is coated with a white paint which absorbs very little solar radiation and has a high infrared radiation-emitting capacity, thereby to limit daytime heating. Cooling is effected by convection through the open-ended nacelle 6. Similarly, the gap between the nacelle and the sunshade promotes air convection for continuous cooling of the nacelle and the sunshade. The external surface of nacelle 6 and the internal surface of sunshade 7 are in polished aluminum in order to restrict radiant-heat transfered between the sunshade and the nacelle. During the daytime the sunshade is at substantially higher than ambient temperature.

The function of the sunshade is to cut off solar and albedo radiation. It absorbs a minimum of radiation flux by reason of its white external surface and transmits a minimum back to the nacelle by reason of its internal polished-aluminum surface.

The polished aluminum surfaces consist of sheets of terphane or polyethylene aluminized in vacuo. The deposit must be thick enough to be virtually non-transparent, the requirement being in all cases to obtain a light, brittle, frangible structure that will shatter instantly in the event of impact with an aircraft.

An active temperature control means 12 powered by power supply 13 and shown schematicaly in FIG. 1 may be provided for supplementing the temperature control provided by the sheathed enclosure of the invention.

FIG. 3 shows the results accordingly obtainable for an altitude of 46,000 feet. The maximum timewise temperature variation (by day, for example) is approximately $dT/dt = 1$ deg/15 min, with an ensuing day/night differential of approximatey 8 deg, and this with a shallow thermal gradient at the heart of the nacelle. The device can be used effectively at any altitude up to 65,000 feet.

Although the enclosure is portrayed in the drawing as being positioned substantially midway along the nacelle, it may in fact be advantageous to arrange it in a more downward position.

It goes without saying that changes and substitutions may be made in the exemplary embodiment described hereinabove without departing from the scope of the invention as set forth in the appended claims.

I claim:

1. A device adapted to be suspended from a tropospheric balloon in a substantially constant temperature environment comprising:
   an apparatus which requires for its correct operation that the temperature thereof be maintained between narrow limits for periods in excess of 24 hours;
   means for maintaining the temperature of said apparatus between narrow limits for periods in excess of 24 hours, said temperature maintaining means comprising a thermally insulated enclosure surrounding and supporting said apparatus, means for providing a solar radiation barrier comprising a sheath open at both ends and having a greater cross-section and greater length than the cross-section and length respectively of said enclosure and connection means for attaching and suspending said enclosure within said sheath with a substantial clearance between the enclosure and the sheath extending over the entire length of the sheath, said connection means including a plurality of cord-like elements having a poor thermal conductivity whereby free circulation of the surrounding air is permitted between said sheath and said enclosure by natural convection.

2. A device as claimed in claim 1, wherein said enclosure includes an evacuated casing of the Dewar flask type that provides heat insulation.

3. A device as claimed in claim 1, wherein said means for providing a solar radiation barrier further comprises a number of additional coaxially arranged sheaths having different cross-sectional areas and disposed inside one another, each sheath being open at both ends and including second connection means having poor thermal conductivity for attaching and suspending every inside sheath to the adjacent surrounding sheath.

4. A device as claimed in claim 1, wherein said enclosure is coated with thermally insulating material that provides heat insulation.

5. A device as claimed in claim 3, wherein said number is only one.

6. A device as claimed in claim 3, wherein the internal surface of the outer sheath of said number of additional sheaths and the internal and external surfaces of the sheaths disposed interiorly of the outer sheath are covered with a low infrared-radiation-emitting coating and wherein the external surface of the outer sheath is covered with a low solar-and-albedoradiation-emitting coating.

7. A device as claimed in claim 6, wherein said low infrared-radiation-emitting coating is aluminum polished to a mirror finish and wherein said low solar-and-albedo-radiation emitting coating is white paint.

8. A device as claimed in claim 1, wherein said enclosure is arranged at least substantially midway along said sheath axis.

9. A device as claimed in claim 1, in which said enclosure is arranged within said sheath between the midpoint of the length of said sheath and one end thereof.

10. A device as claimed in claim 1, including active control means operatively associated with said enclosure for regulating the temperature thereof and including an on-board energy source means for providing energy to said active control means.

11. A device as claimed in claim 1, wherein the elements thereof are fabricated of frangible materials whereby upon impact with an aircraft the device will shatter substantially instantaneously.

12. A device as claimed in claim 3, wherein said enclosure, said sheath and said additional sheaths are coaxially arranged and are generally cylindrically shaped and wherein the length of each sheath is greater than the next adjacent interiorly disposed sheath.

13. A device as claimed in claim 1 wherein said apparatus comprises a crystal oscillator.

* * * * *